United States Patent [19]

Maccarrone et al.

[11] Patent Number: 5,717,698
[45] Date of Patent: Feb. 10, 1998

[54] METHOD AND APPARATUS FOR TESTING A NETWORK WITH A PROGRAMMABLE LOGIC MATRIX

[75] Inventors: Marco Maccarrone, Palestro; Marco Olivo, Bergamo, both of Italy

[73] Assignee: SGS-Thomson Microelectronics S.r.l., Agrate Brianza, Italy

[21] Appl. No.: 345,530

[22] Filed: Nov. 28, 1994

[30] Foreign Application Priority Data

Nov. 30, 1993 [EP] European Pat. Off. ............ 93830478

[51] Int. Cl.$^6$ .................................................. G01R 31/28
[52] U.S. Cl. ........................................ 371/22.2; 371/22.5
[58] Field of Search .......................... 371/21, 22.2, 22.3, 371/21.3, 22.5, 22.6, 25.1; 324/73 R, 158 R, 500, 765; 395/183.19, 183.06; 365/201

[56] References Cited

U.S. PATENT DOCUMENTS

| | | | |
|---|---|---|---|
| 3,958,110 | 5/1976 | Hong et al. | 235/153 AC |
| 4,461,000 | 7/1984 | Young | 371/21 |
| 4,503,387 | 3/1985 | Rutledge et al. | 324/73 R |
| 4,527,115 | 7/1985 | Mehrotra et al. | 324/73 |
| 4,687,959 | 8/1987 | Eitrheim et al. | 307/465 |
| 5,122,738 | 6/1992 | Simpson et al. | 324/158 R |
| 5,155,432 | 10/1992 | Mahoney | 324/158 R |
| 5,457,696 | 10/1995 | Mori | 371/21.3 |

FOREIGN PATENT DOCUMENTS 0422912  4/1991  European Pat. Off. ........ G01R 31/31

OTHER PUBLICATIONS

IEEE Intercon Conference Record, vol. 17, May 12, 1992, New York US, pp. 271–276, Jones R. et al. "Sub–Micron CMOS gate arrays with IEEE 1149.1 JTAG".

*Primary Examiner*—Robert W. Beausoliel, Jr.
*Assistant Examiner*—Nadeem Iqbal
*Attorney, Agent, or Firm*—Wolf, Greenfield & Sacks, P.C.; James H. Morris

[57] ABSTRACT

A circuit architecture for testing a programmable logic matrix, e.g., the PLA type, has a group of input latches and a corresponding group of output latches connected to the matrix, and test information paths structured with at least one data bus and one address bus. The input latch and the output latch are connected electrically to the test data bus and to the test address bus to allow matrix testing with considerable time saving over known circuitry.

6 Claims, 5 Drawing Sheets

METHOD AND APPARATUS FOR TESTING A NETWORK WITH A PROGRAMMABLE LOGIC MATRIX

BACKGROUND OF THE INVENTION

1. Field of the Invention

The present invention relates to a circuit architecture for the configuration of combinatory networks comprising a programmable logic matrix, the circuit for testing of said matrix. The present invention also relates to a method for testing and control of signals deriving from the PLA matrix.

2. Discussion of the Related Art

Many digital devices, such as microprocessors, have memories and/or decoders that contain a control unit provided as a state machine. The state machine includes a combinatory network with a programmable logic matrix and a battery of latches which memorises the state machine. The programmable logic matrix is usually a programmable logic array (PLA) type.

In combinatory networks having a certain complexity, testing of the PLA is very important, and especially if the PLA is a dynamic type. Indeed, the possible failures of a dynamic PLA relate to the logical correctness of the network because the PLA requires a precharging phase for its internal nodes. Since these nodes maintain their value in voltage only by capacitive effect, any resistive discharge paths to ground are a problem.

To check a structure of this type, it is normally necessary to generate a sequence of test vectors which supply data to be applied at an input of the combinatory network and expected outputs that should result from normal operation. Comparing the actual outputs of the device with the expected outputs allows a malfunction to be identified.

A dynamic PLA has timed operation divided into precharge and evaluation which require a synchronisation signal. To carry out a test according to a prior known method, it is necessary to provide this signal through an external pin to the memory circuit, and to connect the PLA inputs with the outputs of one of the binary counters in the circuit. It is therefore necessary to perform a very long count to avoid possible failures. In particular, if the PLA has Ni input bits and output bits, to have a logic value '1' on the most significant bit by activating the transistors connected to a node, it is necessary to perform 2Ni–1 clock cycles. Such an operation takes a long time, thus slowing down the testing.

SUMMARY OF THE INVENTION

It would be desirable to have a combinatory network architecture having a PLA for which it is safer and speedier to perform testing operations while overcoming the shortcomings of the known art.

According to the present invention, the combinatory network uses the input and output latches associated with the PLA to perform the testing.

BRIEF DESCRIPTION OF THE DRAWINGS

The characteristics and advantages of the circuit architecture in accordance with the present invention are set forth in the detailed description with reference to the drawings in which.

DETAILED DESCRIPTION

Figure 1:
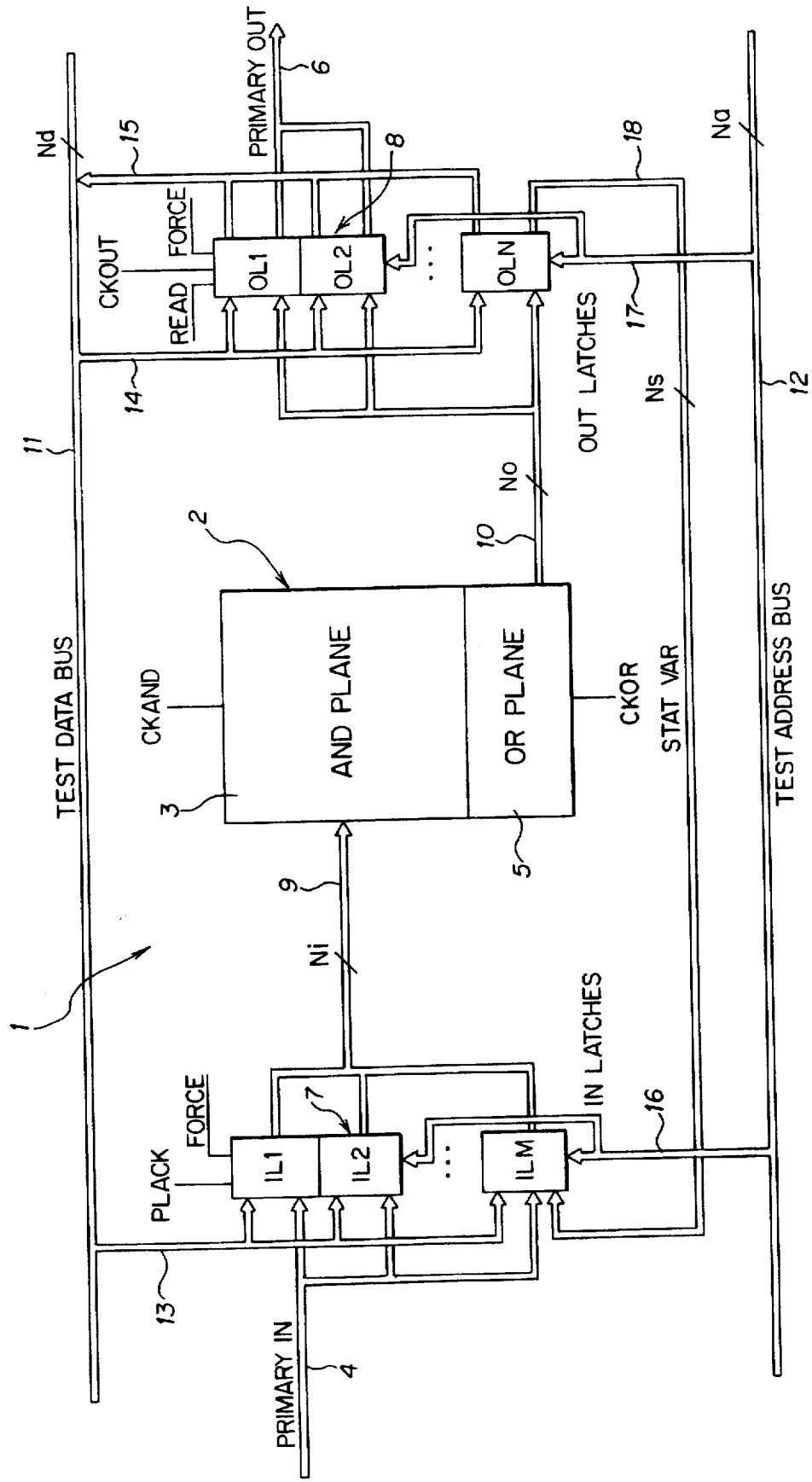
FIG. 1 is a schematic of a circuit architecture in accordance with the present invention.
Figure 4:
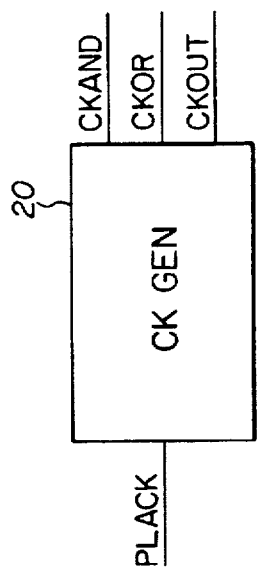
FIG. 4 is a schematic of a clock circuit used with the architecture of FIG. 1.

Referring to FIG. 1, a circuit architecture 1 in accordance with the present invention is provided to facilitate testing of a programmable logic matrix 2. Matrix 2 is a combinatory network, e.g., of the so-called Programmable Logic Array (PLA) type. Matrix 2 has a first AND portion 3 enabled through a clock signal CKAND, and a second OR portion 5 enabled through a clock signal CKOR. Signals CKAND and CKOR are produced by a generator CKGEN 20 that provides these signals, as well as a CKOUT signal, as shown in FIG. 4. The generator can be structurally independent of architecture 1.

Figure 5:
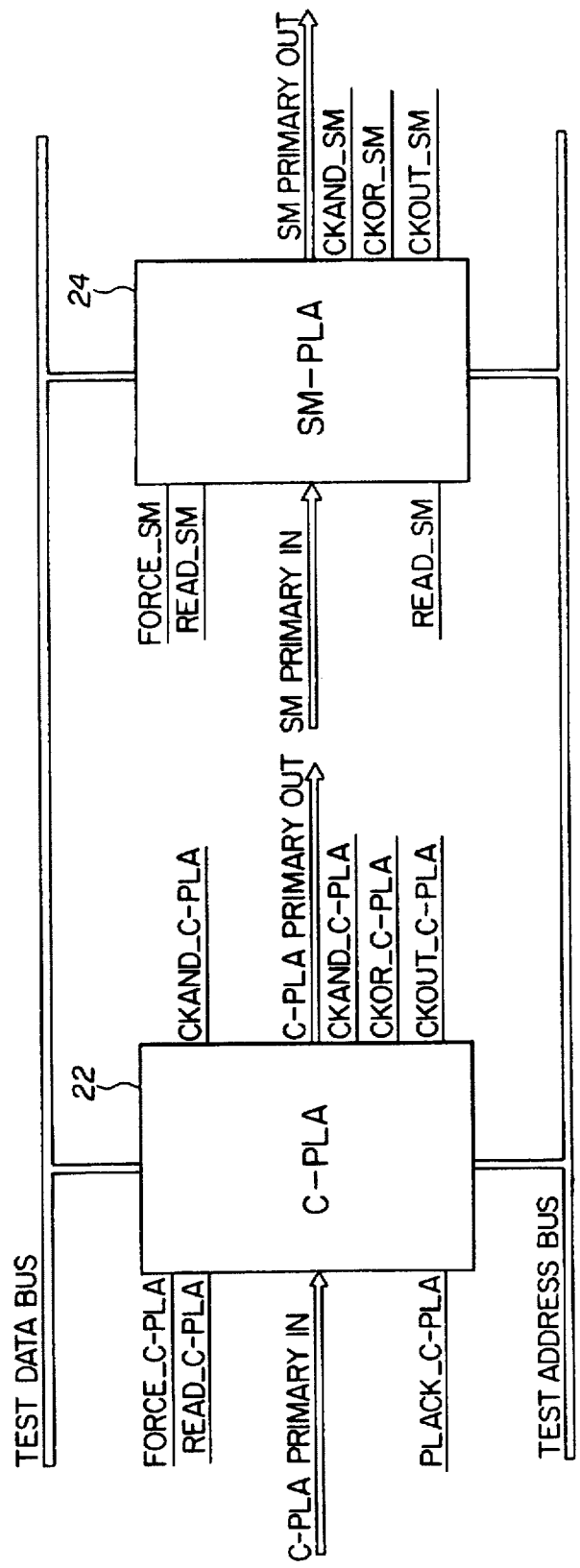
FIG. 5 is a partial block diagram of an integrated memory circuit incorporating the architecture of FIG. 1.

Referring to FIG. 5, at least one pair of matrices 2 of the type set forth is incorporated into a non-volatile integrated memory circuit. A first matrix C-PLA 22 (Command PLA) interprets the commands supplied by the user, e.g. the commands 'read', 'write', and 'erase'. A second matrix SM-PLA 24 (State Machine—PLA) governs performance of the internal algorithms.

Figure 7:
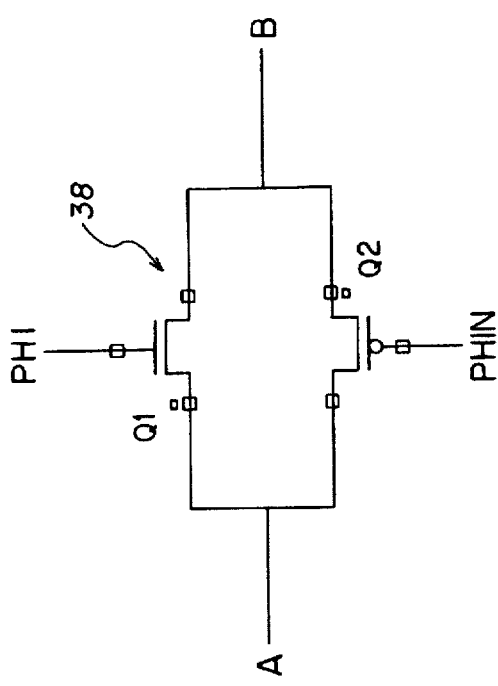
FIG. 7 is a block diagram of generators for use with the circuit of FIG. 5.
Figure 7:
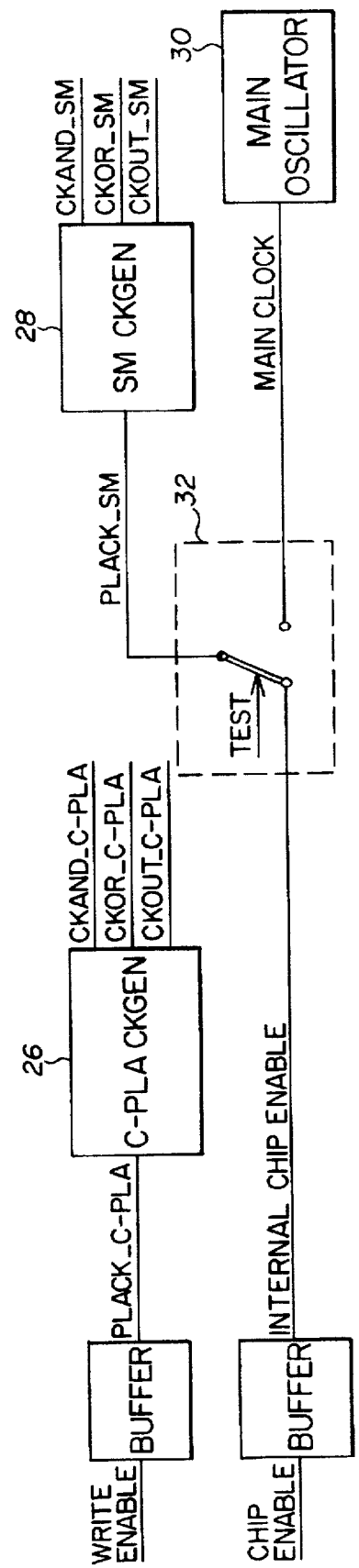

Referring also to FIG. 7, either the first or the second matrix receives respective synchronism signals from respective generators C-PLA CKGEN 26 and SM CRGEN 28, the first of which operates on the basis of the clock signal received on the 'write enable' pin of the integrated memory circuit. The second generator receives synchronism pulse from an internal main oscillator 30 or from a 'Chip Enable' pin of the integrated circuit if in test mode. Switching between the two signals is controlled by a selector 32.

Referring again to FIG. 1, architecture 1 has a group 7 of input latches and a corresponding group 8 of output latches. The input latches are in quantity M are represented IL1, IL2, . . . , ILM; the corresponding output latches of quantity N are represented as OL1, OL2, . . . , OLN. In this case, M and N are greater than or equal to Ni/Nd and No/Nd, respectively. Input latches IL1, IL2, . . . , ILM receive a synchronism signal PLACK produced by generator CKGEN 20 and an enablement signal indicated by the FORCE signal. Output latches OL1, OL2, . . . , OLN receive a synchronism signal CKOUT produced by generator CKGEN 20, a first enablement signal FORCE, and a second enablement signal READ.

A bus 4 for primary connections collects the main input signals to the network. The respective outputs of each of the latches ILi are connected at an input to AND portion 3 through a one-way information bus 9 having Ni bits. The inputs of the corresponding output latches OLi are connected to OR portion 5 through a one-way information bus 10 with No bits. A bus 6 provides the output signals.

Architecture 1 has connections dedicated to testing matrix 2. A data bus 11 with an Nd-bit path and an address bus 12 with an Na-bit path are provided by opposing parts of matrix 2. Bus 11 is electrically connected in parallel and is one-way with respective inputs of the input latches IL1, IL2, . . . , ILM through a path 13. In addition, respective inputs of the output latches OL1, OL2, . . . , OLN are connected in parallel to bus 11 through a one-way path 14.

In this manner, it is possible to externally introduce to the input and output latches test configurations for testing the PLA. Respective outputs of the output latches OL1, OL2, . . . , OLN are connected to bus 11 through a one-way path 15. Paths 14 and 15 could coincide as a single two-way path. Address bus 12 is connected electrically to the input latches through a path 16 and to the output latches through path 17. An Ns-bit connection 18 between an output of latch OLN and an input of the latch ILM completes the structure.

Figure 2:
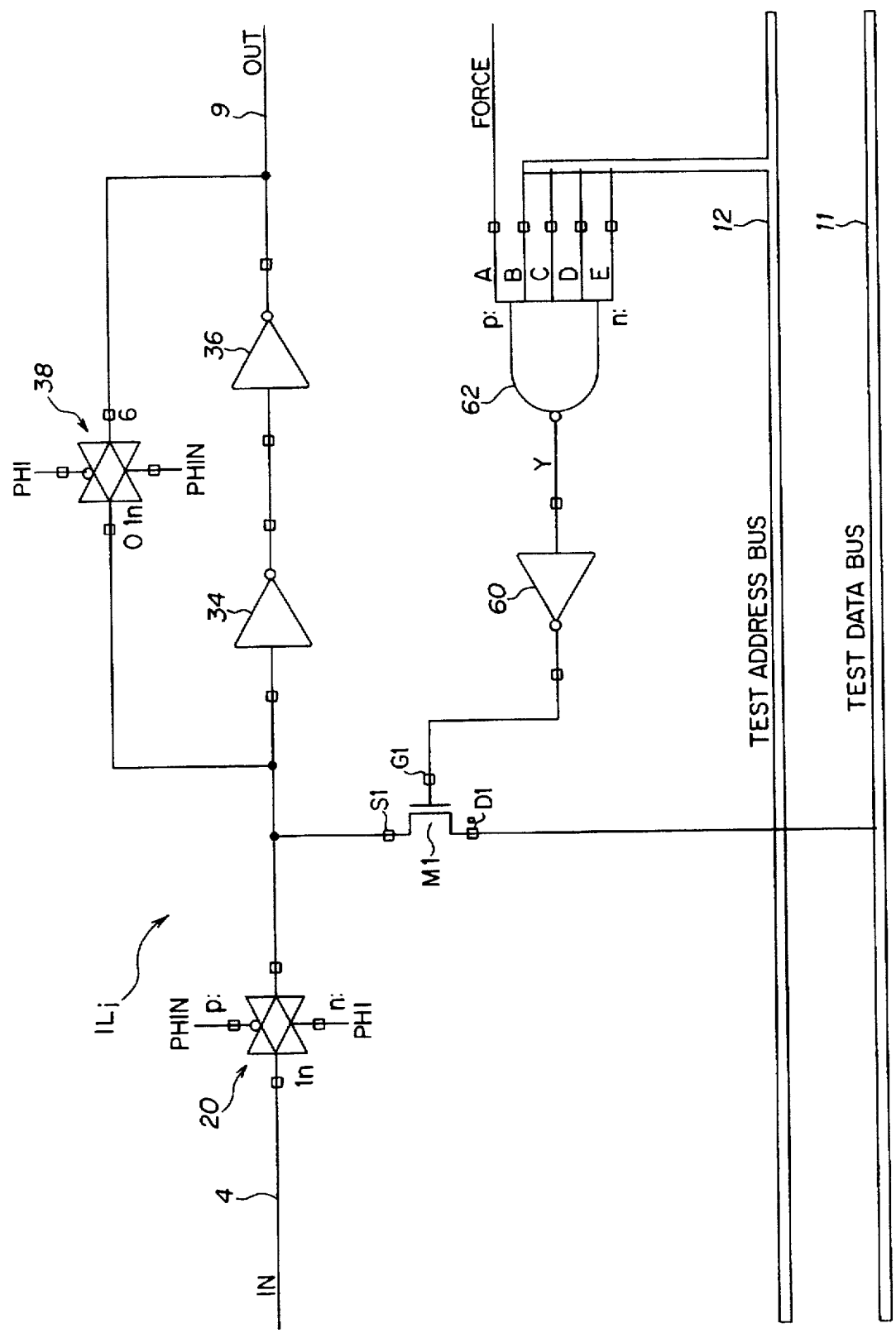
FIGS. 2 and 3 are more detailed schematics of components in the architecture of FIG. 1.

Referring to FIG. 2, data bus 11 is connected to latch ILi through a drain terminal D1 of a field effect transistor M1, preferably an n-channel MOS. Transistor M1 has a gate terminal G1 connected electrically to an output lead of an inverter 30 which is in turn connected to an output lead of a NAND gate 32. Logic gate 32 has four inputs B, C, D, and E connected to address bus 12, and a fifth input A for receiving directly the enablement signal FORCE. A source terminal S1 of the transistor M1 is connected to first and second inverters 34, 36 that are connected in series. The output lead OUT of second inverter 36 is connected in feedback to an input lead of first inverter 34 with the interposition of a one-way pass element 38.

Figure 6:
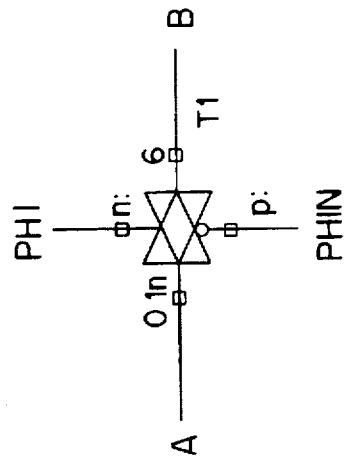
FIG. 6 is a more detailed schematic of components of FIGS. 2 and 3.

Element 38, as shown in greater detail in FIG. 6, preferably includes a pair of transistors, an n-channel MOS Q1 and a p-channel MOS Q2 paired through double drain-source connections. The gate terminals of transistors Q1 and Q2 receive enabling signals PHI and PHIN, respectively. At the input of the first inverter 34 is a signal IN transmitted on the bus 4 through a pass element 20 which can be similar to element 38, or can be a single transistor.

Figure 3:
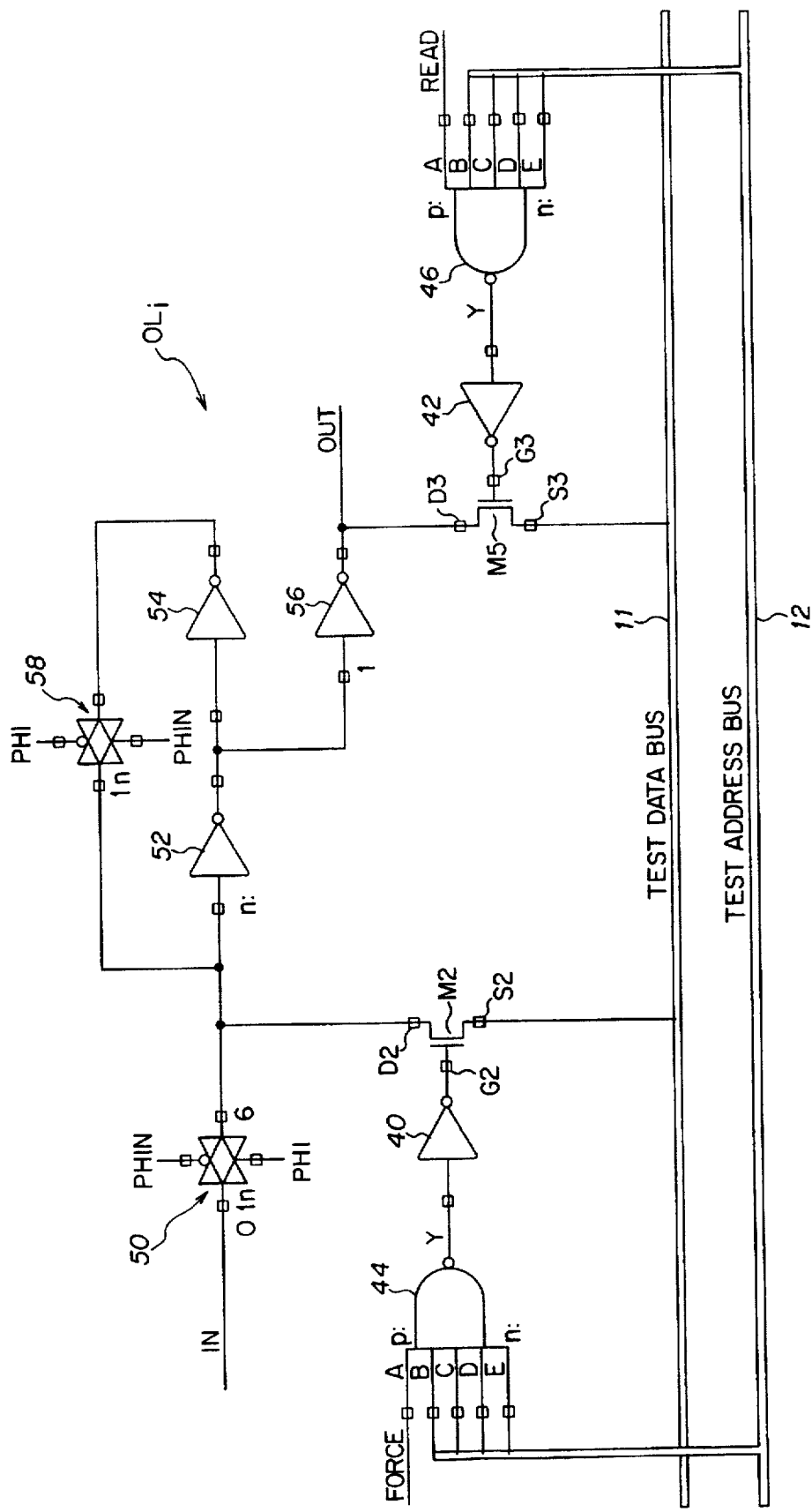

Referring to FIG. 3, output latch OLi is similar in structure to input latch ILi. Latch OLi is connected to data bus 11 through two field effect transistors M2 and M3 through source terminals S2 and S3. Transistors M2 and M3 have gate terminals G2 and G3 connected electrically to the outputs of two inverters 40 and 42, respectively, which have input leads connected to the output leads of two NAND gates 44 and 46. These gates have four inputs B, C, D, and E connected electrically to the address bus 12, and a fifth input A for receiving a signal READ while the corresponding fifth input A of logic gate 44 receives the signal FORCE. Source terminal S1 of the transistor M1 is connected to the output of element 50 which receives at its input lead the signal IN and provides it to an input lead of a series of inverters 52 and 54. The output lead of inverter 52 is also connected to the input lead of a third inverter 56 whose output lead OUT is connected to the drain terminal D3 of the transistor M3. An output lead of second inverter 54 is connected in feedback to the input of the first inverter 52 through element 58.

The latches ILi and OLi have some peculiarities which are explained below. As shown in both FIGS. 2 and 3, the data present on the data bus 11 is forced by a single n-channel transistor without interdicting the feedback elements. Thus, a check phase necessary for extinguishing elements 38, 58 during loading of the data is saved. This is possible by the sizing of the transistors which use resistive feedback transistors, i.e., having a small W:L ratio on which to provide the datum imposed on the n-channel transistors M1 and M2 having a bigger W:L ratio.

In a similar manner, the data stored in the latches is also read using a single n-channel transistor. This is made possible by the fact that, during reading, data bus 11 is connected to a battery of resistive pull-ups which set a high logic condition thereof. When the datum to be read is a logical value '0' n-channel transistor M1, M2 lowers the line voltage. A small, tolerable consumption is introduced in testing. As shown in FIGS. 2 and 3, input latch group 7 and output latch group 8 have enablement logic for the test procedure (FORCE signals) and for decoding the input on the address bus (the READ signal). These signals permit connection of latch groups 7, 8 to buses 11, 12.

FIG. 4 is a schematic of a clock signal generator CKGEN, which supplies at the output clock signals CKAND, which synchronizes AND portion 3; CKOR, which synchronises OR portion 5; CKOUT, which synchronises output latches OLi; and PLACK, which synchronises input latches ILi.

A test method in accordance with the present invention starts from an initial state in which the input latches and output latches lack informative content. On address bus 12 are input addresses that permit activation of the various latches which contain the logic values of the internal nodes to be checked, while on data bus 11 just the logic check values are input. For correct operation of architecture 1, it is necessary that each individual latch IL1, IL2, . . . , ILM and OL1, OL2, . . . , OLN have a parallelism less than or equal to that of data bus 11, indicated by Nd, to be able to supply to the PLA a test logic state and to memorise the output thereof while verifying normal operation. In addition, to better exemplify the operating mechanism of the circuit, the command of the decoding network on a single bit of the latches is shown. In reality, the decoding network pilots an entire element of the input/output latches and not just one bit.

The FORCE signal enables the input latches in group 7 to receive data transmitted on bus 11. The FORCE signal also enables output latches in group 8 to store the output state of the PLA. Through the READ signal, it is thus possible to read this logic state and to evaluate operating conditions of matrix 2.

Since latch groups 7 and 8 are connected together through Na-bit address bus 12, it is necessary that each input and output latch be enabled by one of the possible combinations of address bus 12 (equal to 2Na) to be able to select the line/column to be tested.

In greater detail, the steps of the method can be summarized as follows:

(1) by acting on the FORCE signal and the address bus 12, input latches IL1, IL2, . . . , ILM are enabled in sequence by introducing through them the desired data that is transmitted on bus 11;

(2) a first evaluation cycle of the dynamic PLA is performed by acting on its principal clock CKAND accessible from the exterior;

(3) output latches OL1, OL2, . . . , OLN are read in sequence through the READ signal and address bus 12 to compare the outputs of the OR portion of the PLA with those available as the sample; and (4) the procedure is started over with a new test vector.

By following this procedure, it is also possible to perform tests calling for evolution of the machine for a desired number of steps by performing in sequence several evaluation phases such as that described. In this case, however, it is necessary to keep the feedback path of the state variables that are normally broken by a special signal which inhibits the signals which pilot the PLA during performance of the test. In addition, with circuit architecture in accordance with the present invention, it is possible to directly force output latches 8 through the FORCE signal and to use them thus as normal test latches to check the signals emerging from the PLA under normal operating conditions. Finally, division in blocks of the input and output latches permits keying in of the data through a bus having parallelism less than the number of input bits.

The architecture and testing method in accordance with the present invention are advantageous in terms of surface area of integrated circuit occupied, and in terms of speed of performance of the testing procedure.

Indeed, to properly cover failures, it is no longer necessary to perform a count of at least 2Ni−1 clock cycles. With the present circuit implementation, it is sufficient to apply only the input combinations actually necessary, and to generate an appropriate sequence of tests suited to the content of the PLA in question. This method then permits a considerable savings in time for test performance. This savings is achieved by implementing a circuit architecture which connects the input and output latches with data buses 11 and address buses 12.

This implementation is particularly easy in the greater part of the devices already set up for inspectability and hence equipped with the necessary signals for this approach.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated memory circuit comprising:

a first input terminal;

a first combinatory network;

a group of input latches coupled to the combinatory network to provide signals to the network;

a group of output latches coupled to the combinatory network to receive signals from the network;

a test data bus coupled to the input latches and to the output latches;

a test address bus coupled to the input latches and to the output latches;

a main clock circuit to generate a main clock signal on an output terminal thereof;

a first circuit to provide a test clock signal to the first combinatory network on at least one respective output terminal connected to the first combinatory network, the first circuit including a circuit input terminal; and a switch coupled to the first input terminal, the circuit input terminal of the first circuit and the output terminal of the main clock circuit, the switch to couple the circuit input terminal of the first circuit to the output of the main clock circuit in a first mode of operation and to couple the circuit input terminal of the first circuit to the first input terminal in a second mode of operation;

wherein each input latch includes an input lead and an output lead, the input lead being coupled to the output lead by first and second pass devices connected in series;

a single field effect transistor having a source connected to a node between the first and second pass devices and a drain connected to the test data bus; and a logic circuit having at least one input coupled to the test address bus and an output coupled to a gate of the single field effect transistor so as to activate the single field effect transistor when a predetermined address value is present on the test address bus;

whereby, in the first mode of operation, the first circuit generates the test clock signal as a function of the main clock signal from the main clock circuit and in the second mode of operation, the first circuit generates the test clock signal from a signal provided to the first input terminal.

2. The circuit of claim 1, wherein the input latches and the buses are coupled together through one-way communication paths.

3. The circuit of claim 1, wherein each of the output latches has input leads coupled to the test data bus and to the test address bus.

4. The circuit of claim 1, wherein the output latches have output leads coupled to the test data bus and no output lead coupled to the test address bus.

5. The circuit of claim 1, wherein the network includes an AND plane and an OR plane.

6. The circuit of claim 1, wherein each output latch includes an input lead, an output lead, and first and second MOS transistors, each transistor having source terminals coupled to the data bus and gate terminals coupled to the address bus through logic circuitry, wherein the first transistor has a drain terminal coupled to the input lead of the transistor and the second transistor has a drain terminal coupled to the output lead of the transistor.

* * * * *